(12) United States Patent
Bazarsky et al.

(10) Patent No.: US 10,916,306 B2
(45) Date of Patent: Feb. 9, 2021

(54) BURST MODE OPERATION CONDITIONING FOR A MEMORY DEVICE

(71) Applicant: Western Digital Technologies, Inc., San Jose, CA (US)

(72) Inventors: Alex Bazarsky, Holon (IL); Idan Alrod, Kfar Saba (IL); Eran Sharon, Rishon Lezion (IL); Ariel Navon, Revava (IL); Chris Petti, Mountain View, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/295,969

(22) Filed: Mar. 7, 2019

(65) Prior Publication Data

US 2020/0286556 A1 Sep. 10, 2020

(51) Int. Cl.
*G06F 12/00* (2006.01)
*G11C 13/00* (2006.01)
*G06F 3/06* (2006.01)

(52) U.S. Cl.
CPC ........ *G11C 13/0069* (2013.01); *G06F 3/0604* (2013.01); *G06F 3/0644* (2013.01); *G06F 3/0679* (2013.01); *G11C 13/0004* (2013.01); *G11C 13/0061* (2013.01)

(58) Field of Classification Search
CPC ............ G11C 13/0069; G11C 13/0061; G11C 13/0004; G06F 3/0604; G06F 3/0644; G06F 3/0679
USPC ......................................................... 711/154
See application file for complete search history.

(56) References Cited

U.S. PATENT DOCUMENTS

| | | |
|---|---|---|
| 6,545,907 B1 | 4/2003 | Lowrey et al. |
| 7,075,841 B2 | 7/2006 | Resta et al. |
| 7,274,586 B2 | 9/2007 | Choi et al. |
| 7,463,520 B2 | 12/2008 | Aritome |
| 7,580,287 B2 | 8/2009 | Aritome |
| 7,983,069 B2 | 7/2011 | Hsu et al. |
| 8,199,566 B1 | 6/2012 | Fackenthal et al. |
| 8,725,935 B2 | 5/2014 | Huang et al. |
| 9,430,735 B1 | 8/2016 | Vali et al. |
| 9,530,491 B1 | 12/2016 | Uttarwar et al. |

(Continued)

FOREIGN PATENT DOCUMENTS

| | | |
|---|---|---|
| CN | 106485317 A | 3/2017 |
| CN | 107301455 A | 10/2017 |

OTHER PUBLICATIONS

Chi et al.; "Prime: A Novel Processing-in-memory Architecture for Neural Network Computation in ReRAM-based Main Memory;" 2016 ACM SIGARCH Computer Architecture News; Jun. 18, 2016; vol. 44, No. 3, pp. 27-39; IEEE Press; https://seal.ece.ucsb.edu/sites/seal.ece.ucsb.edu/files/publications/prime_isca_2016.pdf.

(Continued)

*Primary Examiner* — Mardochee Chery
(74) *Attorney, Agent, or Firm* — Patterson & Sheridan, LLP; Steven H. Versteeg

(57) ABSTRACT

A controller for a phase change memory forms a dedicated burst write partition in the phase change memory and initializes memory cells of the dedicated burst write partition to a SET state. Programming of selected memory cells in the dedicated burst write partition is carried out using only RESET pulses.

8 Claims, 8 Drawing Sheets

(56) References Cited

U.S. PATENT DOCUMENTS

| | | | |
|---|---|---|---|
| 9,646,243 | B1 | 5/2017 | Gokmen |
| 9,880,760 | B2 | 1/2018 | Inbar et al. |
| 10,090,044 | B2 | 10/2018 | Achtenberg et al. |
| 10,430,328 | B2 | 10/2019 | Sela et al. |
| 2010/0027329 | A1* | 2/2010 | Lee .................. G11C 8/06 365/163 |
| 2012/0311262 | A1 | 12/2012 | Franceschini et al. |
| 2013/0013860 | A1* | 1/2013 | Franceschini et al. |
| 2016/0077968 | A1 | 3/2016 | Sela et al. |
| 2016/0099057 | A1 | 4/2016 | Dusija et al. |
| 2017/0068451 | A1 | 3/2017 | Kenan et al. |
| 2017/0337466 | A1 | 11/2017 | Bayat et al. |
| 2018/0075344 | A1 | 3/2018 | Ma et al. |
| 2018/0232508 | A1 | 8/2018 | Kursun |
| 2018/0330238 | A1 | 11/2018 | Luciw et al. |
| 2019/0073259 | A1 | 3/2019 | Qin et al. |
| 2019/0243787 | A1 | 8/2019 | Mittal et al. |
| 2019/0258920 | A1 | 8/2019 | Lie et al. |
| 2020/0184335 | A1 | 6/2020 | Rom et al. |
| 2020/0185027 | A1 | 6/2020 | Rom et al. |

OTHER PUBLICATIONS

Choe et al.; "Near-Data Processing for Machine Learning"; 2017; International Conference on Learning Representations; https://openreview.net/pdf?id=H1_EDpogx; 12 pages.

Final Office Action in U.S. Appl. No. 16/212,596, filed Dec. 6, 2018, FOA dated Jun. 29, 2020.

Hadidi et al.; "Demystifying the Characteristics of 3D-Stacked Memories: A Case Study for Hybrid Memory Cube"; Georgia institute of Technology; Oct. 3, 2017; https://arxiv.org/pdf/1706.02725.pdf; 10 pages.

Jia et al,; "A Microprocessor Implemented in 65nm CMOS with Configurable and Bit-scalable Accelerator for Programmable In-memory Computing"; Nov. 9, 2018; https://arxiv.org/pdf/1811.04047.pdf; 10 pages.

Kim et al.; "A 68 Parallel Row Access Neuromorphic Core with 22K Multi-Level Synapses Based on Logic-Compatible Embedded Flash Memory Technology"; 2018 IEEE International Electron Devices Meeting (IEDM); 2018; 4 pages.

Liang et al.; "Cognitive SSD: A Deep Learning Engine for In-Storage Data Retrieval"; 2019 USENIX Annual Technical Conference; Jul. 2019; 17 pages.

Nielsen, Michael; "Neural Networks and Deep Learning, Chapter 2: How the backpropagation algorithm works";2015; http://neuralnetworksanddeeplearning.com/chap2.html; 27 pages.

Park et al.; "A hybrid flash translation layer design for SLC-MLC flash memory based multibank solid state disk"; Microprocessors and Microsystems; vol. 35, Issue 1; Feb. 2011; pp. 48-59; https://doi.org/10.1016/j.micpro.2010.08.001.

Srivastava et al.; "Dropout: A Simple Way to Prevent Neural Networks from Overfitting"; Journal of Machine Learning Research 15; 2014; 30 pages.

Sullivan, John; "Merging Memory and Computation, Programmable Chip Speeds AI, Slashes Power Use"; Nov. 15, 2018; https://m.techxplore.com/news/2018-11-merging-memory-programmable-chip-ai.html; 5 pages.

Valavi et al.; "A Mixed-Signal Binarized Convolutional-Neural-Network Accelerator Integrating Dense Weight Storage and Multiplication for Reduced Data Movement"; VLSI Symp. on Circuits (VLSIC); Jun. 2018; http://www.princeton.edu/~nverma/VermaLabSite/Publications/2018/ValaviRamadgeNestlerVerma_VLSI18.pdf; 2 pages.

Wong et al.; "Phase Change Memory: A comprehensive and thorough review of PCM technologies, including a discussion of material and device issues, is provided in this paper"; Proceedings of the IEEE; vol. 98, No. 12; Dec. 2010; https://nanoheat.stanford.edu/sites/default/files/publications/A126.pdf; 27 pages.

U.S. Appl. No. 16/397,993, filed Apr. 29, 2019, Eran sharon.

\* cited by examiner

BURST MODE OPERATION CONDITIONING FOR A MEMORY DEVICE

BACKGROUND

Phase change memory technology is a promising candidate for next generation non-volatile memory devices. Phase change memory enables the capability to independently reprogram single bits (bit-addressable) without a need for block erasing, as required with other types of non-volatile memory, e.g., FLASH memory.

In phase change memory a state transition from the crystalline state (a high current, low resistivity state) to the amorphous state (a low current, high resistivity state relative to the crystalline state) is substantially faster than a state transition from the amorphous state to the crystalline state. This state change asymmetry is a significant source of burst mode write latency in phase change memory devices. Burst mode is a well known technique in which bus management overhead is temporarily decreased in order to increase write data throughput. Burst write is therefore a high-throughput data transfer operation.

BRIEF SUMMARY

Disclosed herein are techniques to decrease burst write latency in a bit-addressable non-volatile memory having an asymmetric state change characteristic, such as a phase change memory device.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Disclosed herein are techniques to reduce burst write latency in a bit-addressable non-volatile memory having an asymmetric state change characteristic, such as a phase change memory device. A SET state transition background operation is applied to a dedicated burst write partition to shift selected memory cells into a SET state. A "background operation" refers to management operations that can be performed when the non-volatile memory system is not processing any host requests (such as burst write operations). For example, configuring the dedicated burst write partition size and location, and configuring memory cells of the dedicated burst write partition into the SET state are background operations because they may be performed and completed prior to and therefore don't block a burst write operation. A "dedicated burst write partition" is a set of memory addresses configured for favored use by burst write operations. A dedicated burst write partition is typically, but not necessarily, a contiguous range of physical addresses within a memory array. A dedicated burst write partition may be used exclusively for burst write operations or may be used opportunistically for other-than-burst write operations as well as for burst write operations. However, the dedicated burst write partition will be a preferred set of memory cells for targeting burst write operations to.

After preparing the dedicated burst write partition, a foreground operation RESET state transition is applied to selected memory cells from the set placed into the SET state. A "foreground operation" is other than a background operation, e.g., actions that involve processing a host request and thus do not interrupt or delay a burst write operation or memory read operation and thus compete with host request fulfillment for resources of the memory system.

The selected memory cells are cells identified to be placed into a high resistive state so as to be programmed using a RESET state transition.

The phase change memory RESET state transition is faster (e.g., 8X faster) than the SET state transition. Burst write latency may thus be reduced by shifting an entire memory block into a low resistance crystalline state (SET state) in a background operation, and then programming selected cells for the high resistive state using a faster RESET pulse.

Figure 1:
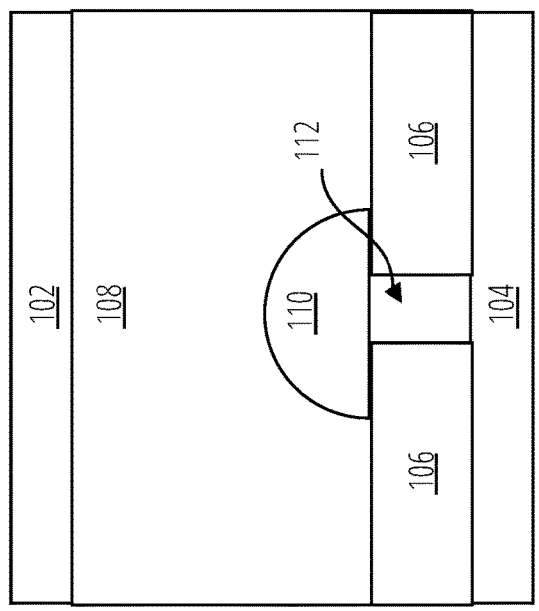
FIG. 1 illustrates a phase change memory cell.

FIG. 1 illustrates a phase change memory cell comprising a top electrode 102, a bottom electrode 104, and a phase change material 108.

Electric current passes from the top electrode 102 to the bottom electrode 104 by way of a heater region 112 between regions of insulator 106. The electric charge from the top electrode 102 is funneled into the heater region 112 by the insulator 106, causing the heater region 112 to heat up. This creates a phase change in the phase change material 108 forming a programmed region 110.

Figure 2:
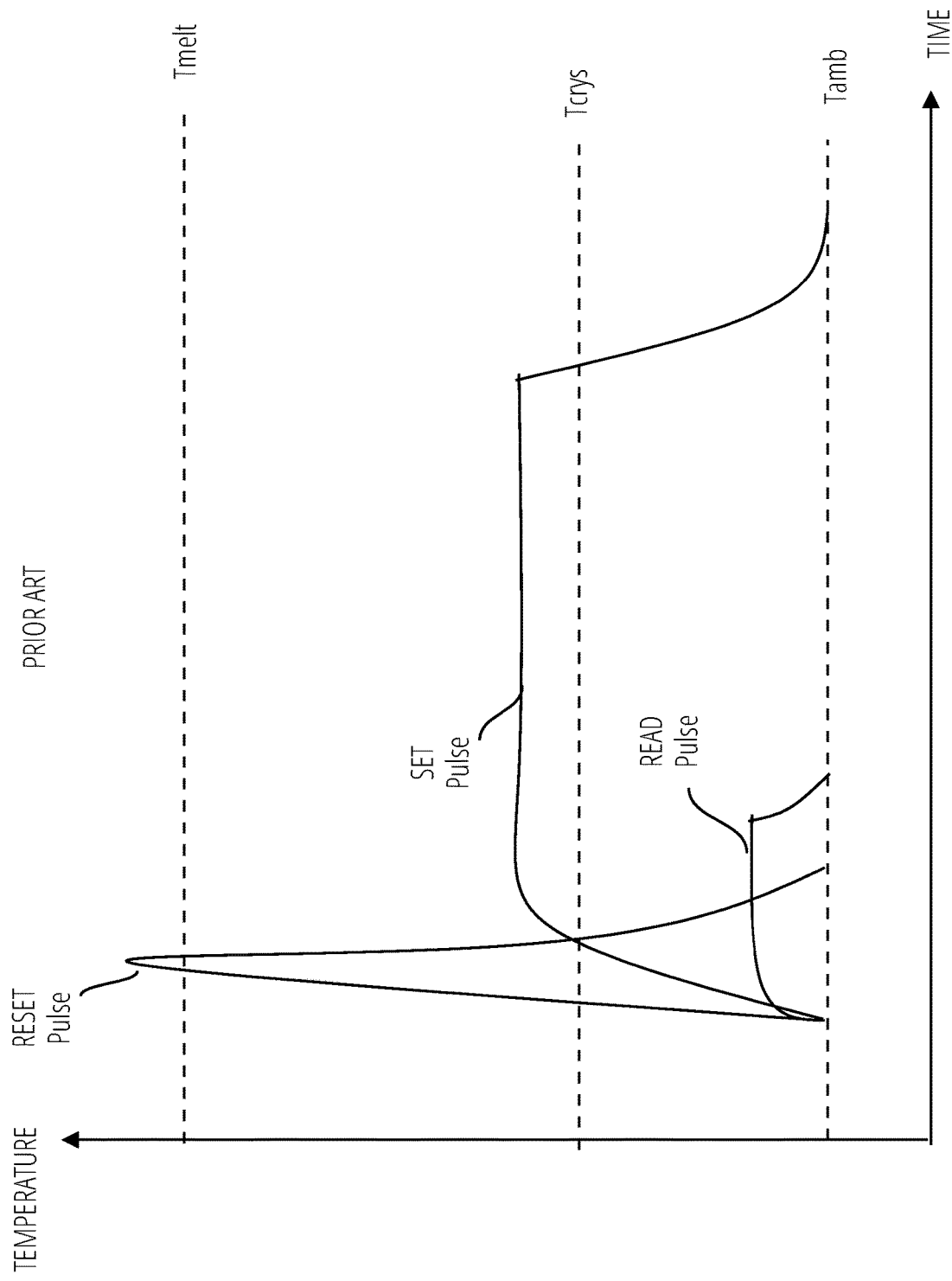
FIG. 2 illustrates a control signals in accordance with one embodiment.
Figure 3:
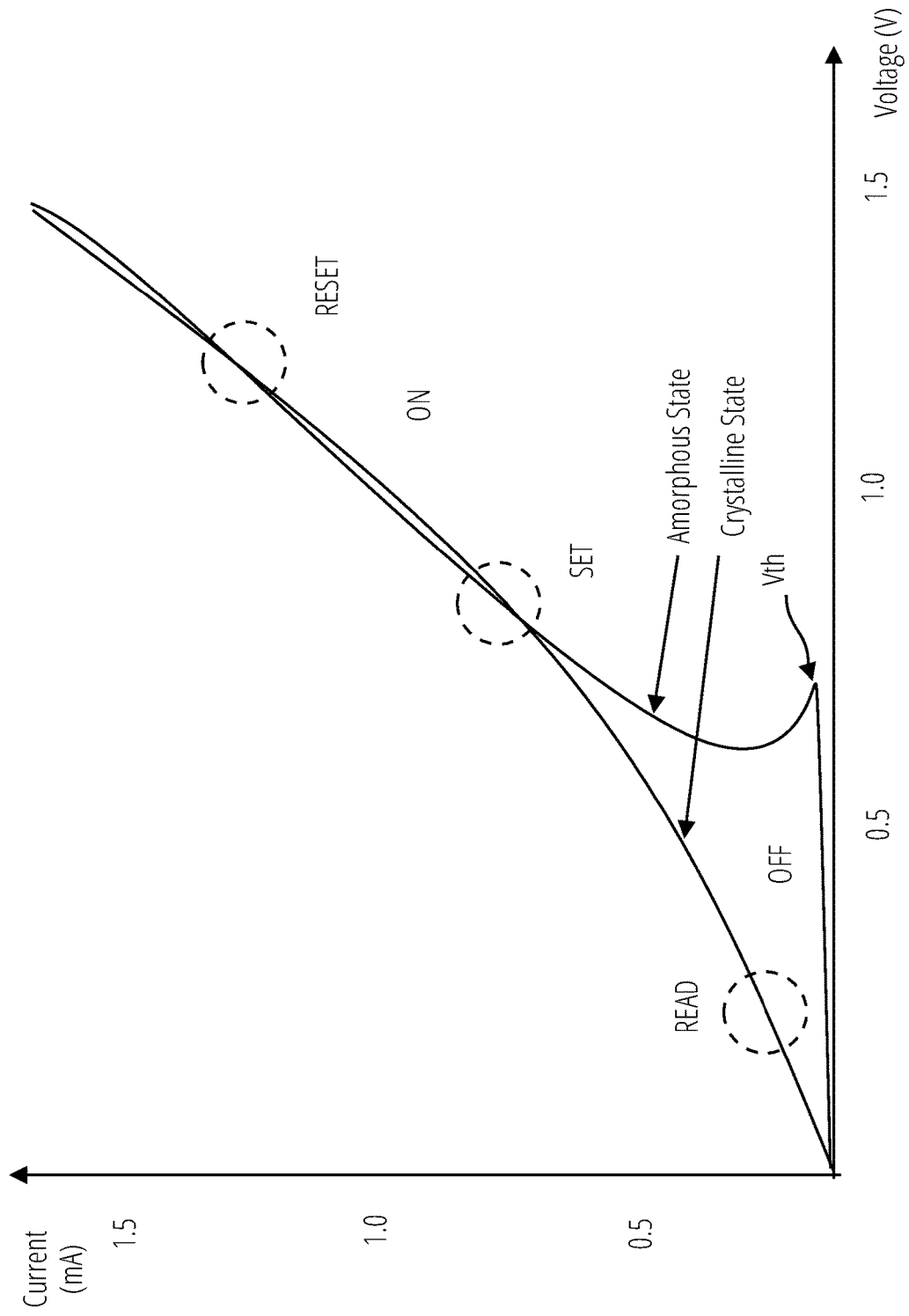
FIG. 3 illustrates a SET state and RESET state characteristics in accordance with one embodiment.

FIG. 2 illustrates exemplary control signals to program (set), read, and reset the phase change memory cell. FIG. 3 illustrates exemplary SET state and RESET state characteristics for the phase change memory cell. The phase change material exhibits switching characteristics near the threshold voltage Vth. Below Vth the phase change material exhibits high resistance and switches to a low-resistance conductive state at or slightly above Vth. The READ pulse does not have sufficient voltage or current to induce a phase change. However the SET pulse has sufficient current and voltage to induce a SET state transition, and the RESET pulse, with even higher current, induces a RESET state transition.

FIG. 3 illustrates SET state and RESET state characteristics in one embodiment. The crystalline lattice structure of the phase change material undergoes operationally distinct transformations above the threshold voltage depending on the magnitude of the current applied. At each state the phase change material exhibits a different resistivity factor. Such phase change materials may be formed for examples using combinations of Ge, Sb, and Te.

Binary state phase change materials take the longest to transition past the threshold voltage to the SET state. From the SET state the RESET state can be programmed by applying relatively short current pulses of higher amplitude.

Figure 4:
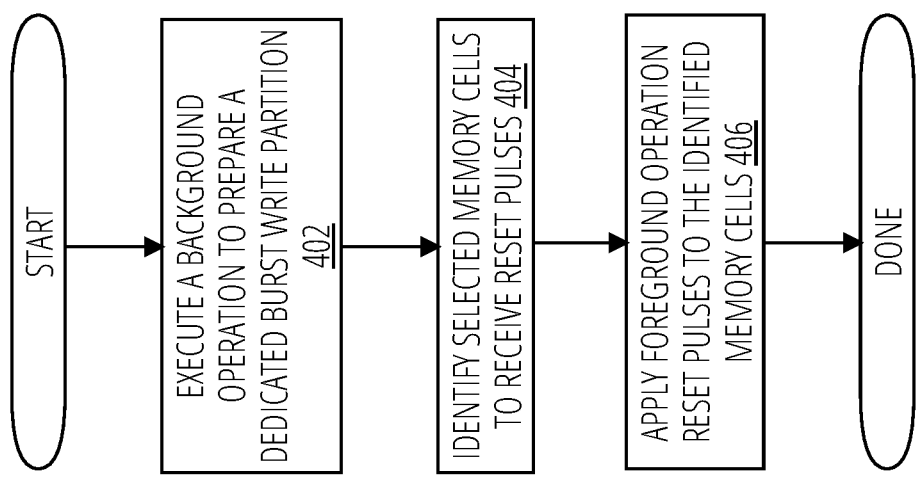
FIG. 4 illustrates a phase change memory programming process in accordance with one embodiment.

FIG. 4 illustrates a phase change memory programming process in one embodiment. Action 402 executes a background operation to prepare a dedicated burst write partition in a phase change memory. Action 404 identifies memory cells of the dedicated burst write partition to receive RESET pulses. The identified memory cells are those cells corresponding to write addresses for a detected burst write operation. Action 406 executes a foreground operation to apply the RESET pulses to the identified memory cells.

In one embodiment the phase change memory programming process prepares a dedicated burst write partition with all memory cells in the crystalline SET state. Burst write operations for data bits not represented by the SET state are dynamically directed to the burst write partition, reducing burst write latency and improving memory programming bandwidth in burst write mode. During the burst write operation memory cells are programmed using only the faster RESET pulses and are only programmed if the data is not represented by the SET state. Depending on the implementation, the SET state may represent a logical one or a logical zero.

For non-burst write mode operations, conventional phase change memory programming operations are applied to other areas (not the dedicated burst write partition) of the phase change memory.

Figure 5:
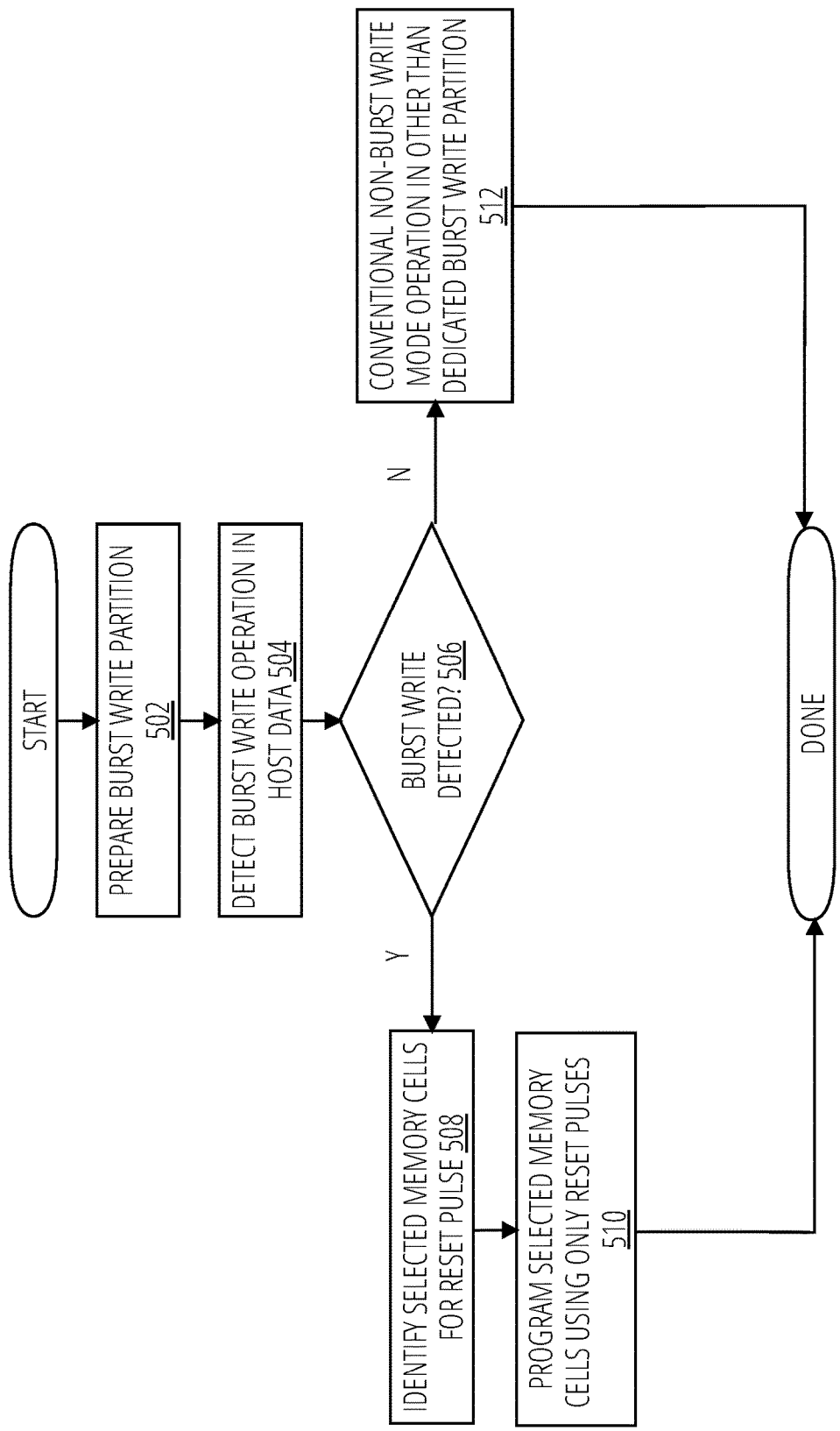
FIG. 5 illustrates a more detailed phase change memory programming process in accordance with one embodiment.

FIG. 5 illustrates a more detailed phase change memory programming process in one embodiment. Action 502 prepares the memory cells (e.g., all functional memory cells) of the dedicated burst write partition in the phase change memory into the SET state. This may typically be performed as a background operation and may include relocating the contents of memory cells having a valid indication (typically a metadata bit associated with the memory cell) to memory locations outside the dedicated burst write partition boundaries. Once the dedicated burst write partition is initialized and the phase change memory is ready for burst write activity, a burst write operation to the phase change memory may be detected (action 504, evaluation action 506). This may be performed in a number of ways, but in a typical embodiment data from a host device that utilizes the phase change memory is analyzed in manners known in the art to detect a burst write. For example the burst write may be evidenced by an explicit burst write command identifying a sequential set of data on the memory bus for writing in burst mode. If the burst write operation is not explicit, it may be identified by the sequential nature of the virtual or physical addresses of the data to write. Other manners of identifying burst write operations will be apparent to those of ordinary skill in the art.

If a burst write operation is detected, action 508 identifies the particular memory cells of the dedicated burst write partition to program with the burst data. This may be done using memory mapping techniques known in the art to identify unused areas of the dedicated burst write partition. A memory management unit for the phase change memory may carry out action 508 in manners known in the art. Action 510 programs the identified memory cells using only RESET pulses. No READ pulses or SET pulses are applied during the programming of the identified memory cells. Herein expressions such as "only using" or "only applying" and the like when referring to signal pulses has the meaning that memory cells are programmed without applying signals for reading the memory cells and without signals to cause other programming phase changes to the memory cells other than those indicated by the context.

A simplified algorithm for performing the burst write operation is:

for (each bit i in the burst data)
  if bit(i)=='1'
    apply RESET pulse to corresponding memory cell of the phase change memory
  endif
next i If a burst write operation is not detected, action 512 carries out a non-burst write mode operation in an area of the phase change memory other than the dedicated burst write partition.

In one embodiment a sub-region less than the entire dedicated burst write partition is conditioned into the SET state enabling a tradeoff of the latency for the background operation and the time and capacity available to carry out the burst write operations. This is effectively the same as conditioning the dedicated burst write partition in stages, for example as background operation resources come available. In other words, it's a dedicated burst write partition of dynamic size that changes over time.

The phase change memory programming processes shown in FIG. 4 and FIG. 5 are examples of techniques that may be applied in devices that often utilize burst write operations, for example devices utilized with streaming audio and/or video.

A size of the dedicated burst write partition may be configured statically or may be dynamically configured. For example a static size may be utilized for implementations in which the amount of burst memory utilized in operation is within a predictable range (e.g., as determined by application profiling). A dynamic partition may be utilized for example for implementations in which there is a wide range of burst mode behavior and in which there are facilities or functions that provide useful boundaries on the size of burst mode activity (e.g., applications that utilize the "free" C-language operation).

In some embodiments, the host device explicitly instructs the memory controller on the size and/or address ranges for the dedicated burst write partition.

A modern phase change memory system may utilize a RESET pulse length as short as one eighth the duration of the SET pulse length. For a SET pulse of length X and RESET pulse of length $\frac{1}{8}X$ and assuming an equal number of '0' and '1' values in the burst write operation data, the phase change memory programming processes shown in FIG. 4 and FIG. 5 reduce the write latency by a factor of four (4). For a worst-case scenario in which all of the burst write operation data is to be programmed to the RESET state the latency is reduced by a factor of eight (8). Burst mode operation of phase change memory devices may thus be substantially improved using these techniques in many cases.

Once the memory cells of the dedicated burst write partition are conditioned into the SET state, it is unnecessary to read them before performing a programming operation during a burst write operation, which achieves additional performance benefits.

Figure 6:
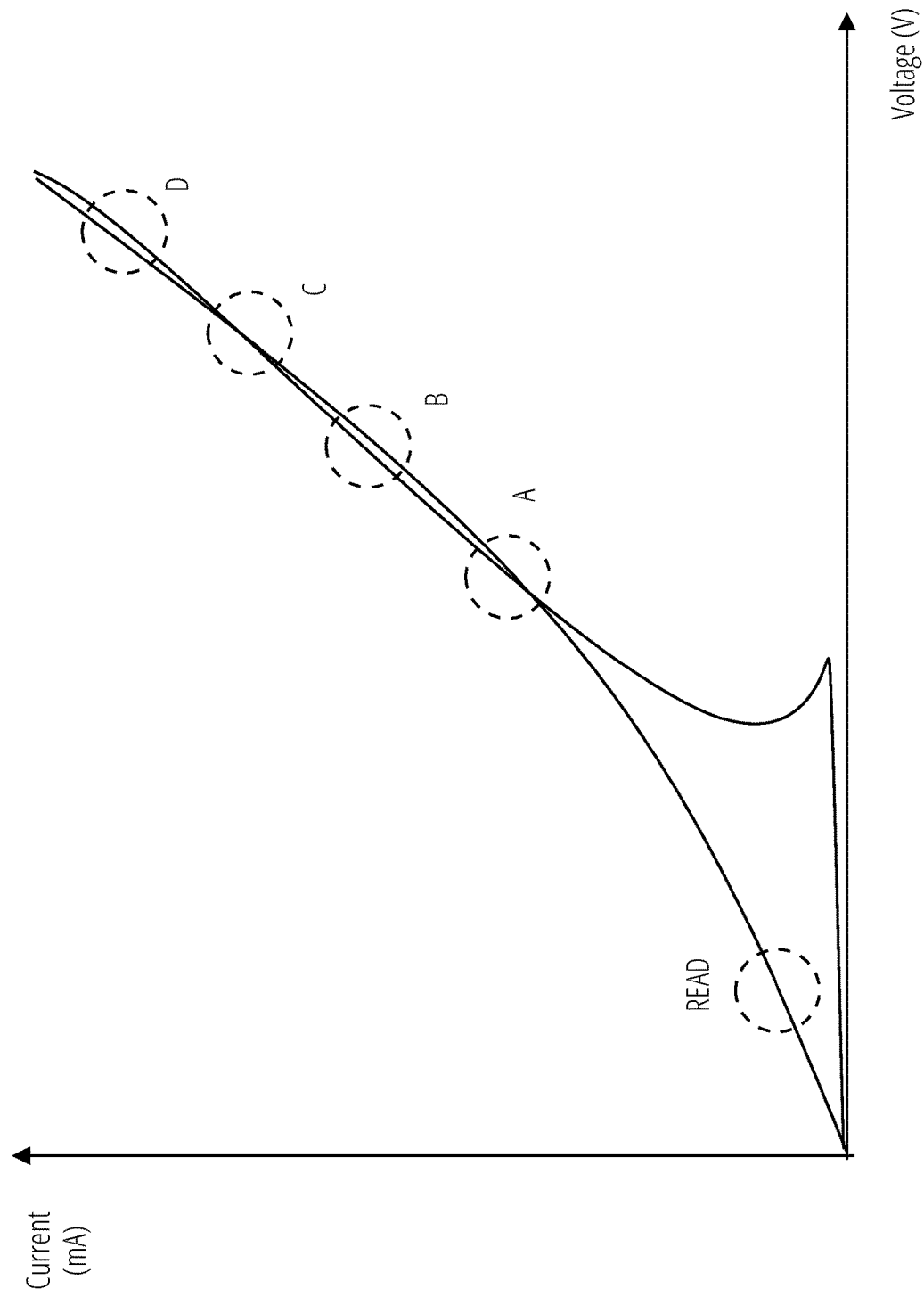
FIG. 6 illustrates a multi-bit phase change memory characteristics in accordance with one embodiment.

FIG. 6 illustrates a multi-bit phase change memory characteristics in one embodiment. The crystalline lattice structure of the phase change material undergoes operationally distinct transformations (A state, B state, C state, and D state in this example) above the threshold voltage depending on the magnitude of the current applied. At each state the phase change material exhibits a different resistivity factor. Such phase change materials may be formed for examples using combinations of Ge, Sb, and Te.

As with binary state phase change materials it takes the longest to transition past the threshold voltage to the first (A) state (analogous to the SET state for a binary state phase change material). From the A state other states can be programmed by applying current pulses of successively higher amplitude.

Figure 7:
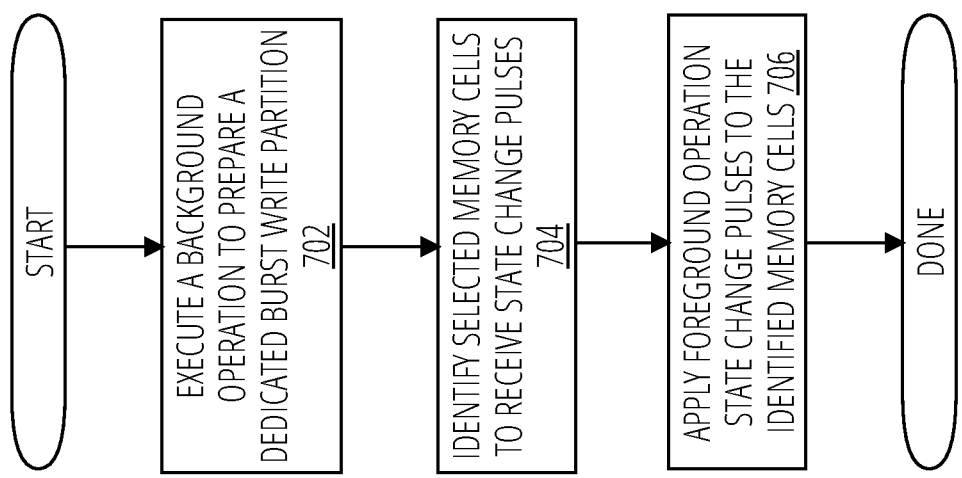
FIG. 7 illustrates a multi-bit phase change memory programming process in accordance with one embodiment.

FIG. 7 illustrates a multi-bit phase change memory programming process in one embodiment. Action 702 executes a background operation to prepare a dedicated burst write partition in a phase change memory. Action 704 identifies selected memory cells of the dedicated burst write partition to receive state change pulses. The identified memory cells are those cells corresponding to write addresses for a detected burst write operation. Action 706 executes a foreground operation to apply the state change pulses to the identified memory cells.

In one embodiment the multi-bit phase change memory programming process prepares a dedicated burst write partition with all memory cells in the crystalline A state. Burst write operations for data bits not represented by the A state are dynamically directed to the burst write partition with the corresponding current strength, reducing burst write latency and improving memory programming bandwidth in burst write mode. During the burst write operation memory cells are programmed using only the faster B state, C state, or D state pulses and are only programmed if the data is not represented by the A state. Depending on the implementation the different states may represent different two-bit symbols (e.g., the A state may represent '00', the B state may represent '01', and so on. Depending on the implementation, the dedicated burst write partition may be prepared in a state other than the A state, for example in the B or C state, to minimize the number of highest magnitude current pulses needed to program the phase change memory for common burst write operations encountered in the implementation.

For non-burst write mode operations, conventional phase change memory programming operations are applied to other areas (not the dedicated burst write partition) of the phase change memory.

Figure 8:
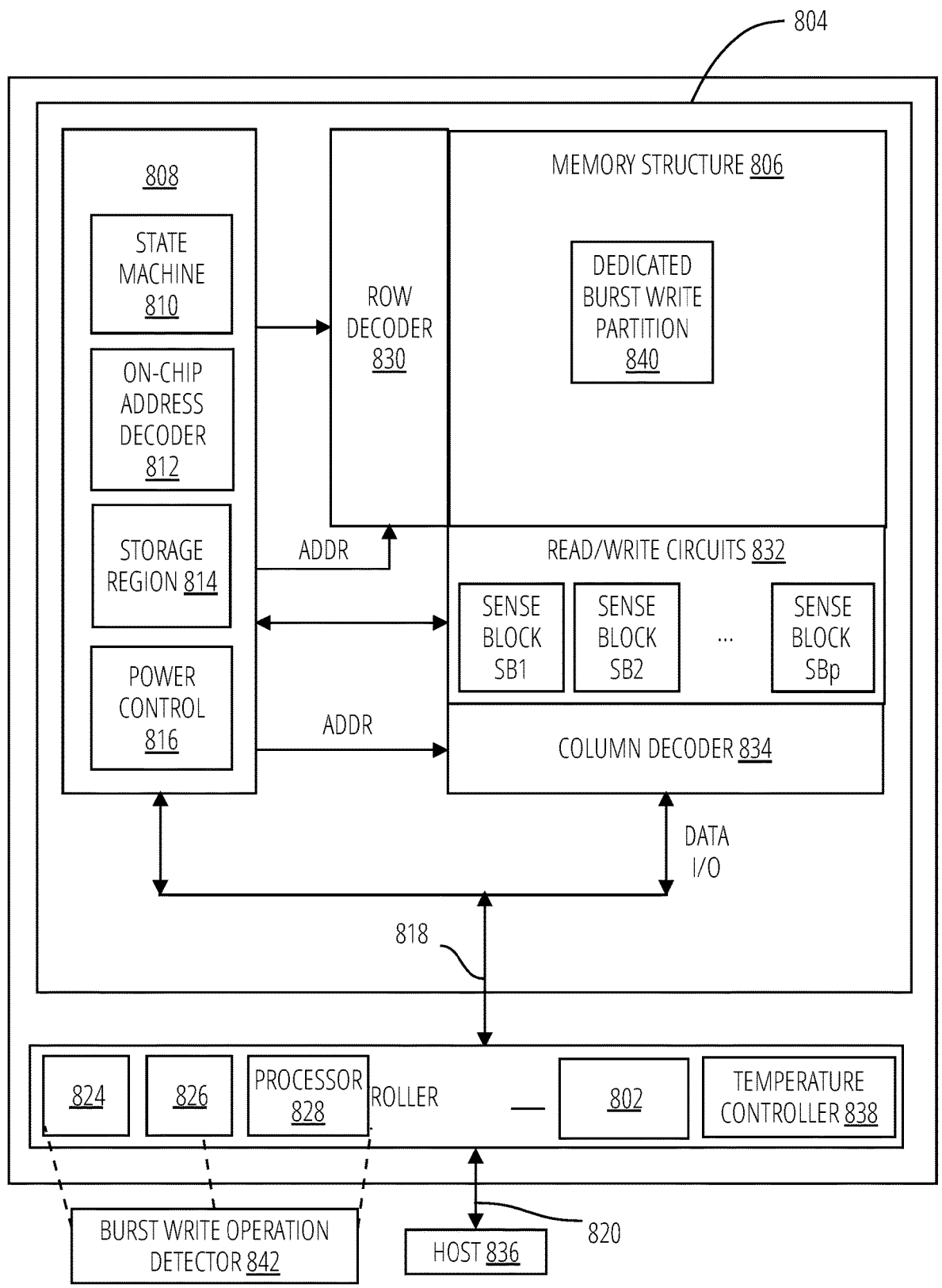
FIG. 8 is a block diagram of an example memory device in one embodiment.

FIG. 8 is a block diagram of an exemplary memory device. The memory device may include one or more memory die 804. The memory die 804 includes a memory structure 806 of memory cells, such as an array of memory cells herein referred to as a memory array, an address controller 808, and read/write circuits 832. The memory structure 806 is addressable by word lines via a row decoder 830 and by bit lines via a column decoder 834. The read/write circuits 832 include multiple sense blocks SB1, SB2, . . . , SBp (sensing circuitry) and allow a page of memory cells to be read or programmed in parallel. Typically a read/write controller 822 is included in the same memory device (e.g., a removable storage card) as the one or more memory die 804. Commands and data are transferred between the host device 836 and read/write controller 822 via a data bus 820, and between the controller and the one or more memory die 804 via lines 818.

The memory structure 806 can be 2D (laid out in a single fabrication plane) or 3D (laid out in multiple fabrication planes). The memory structure 806 may comprise one or more array of memory cells including a 3D array. In one embodiment, the memory structure 806 may comprise a monolithic three-dimensional memory structure (3D array) in which multiple memory levels are formed above (and not in) a single substrate, such as a wafer, with no intervening substrates. The memory structure 806 may comprise any type of non-volatile memory that is monolithically formed in one or more physical levels of arrays of memory cells having an active area disposed above a silicon substrate. The memory structure 806 may be in a non-volatile memory device having circuitry associated with the operation of the memory cells, whether the associated circuitry is above or within the substrate.

The address controller 808 cooperates with the read/write circuits 832 to perform memory operations on memory cells of the memory structure 806, and includes a state machine 810, an address decoder 812, a temperature controller 838, and a power control 816. The state machine 810 provides chip-level control of memory operations. A store region selector 814 may be provided, e.g., for programming parameters as described further below.

The address decoder 812 provides an address interface between that used by the host or a read/write controller 822 to the hardware address used by the row decoder 830 and column decoder 834. The power control 816 controls the power and voltages supplied to the various control lines during memory operations. The power control 816 and/or read/write circuits 832 can include drivers for word lines, source gate select (SGS) transistors, drain gate select (DGS) transistors, bit lines, substrates (in 2D memory structures), charge pumps, and source lines. The power control 816 can therefore include various first voltage generators (e.g., the drivers) to generate the voltages described herein. The sense blocks can include bit line drivers and sense amplifiers in one approach.

In some implementations, some of the components can be combined. In various designs, one or more of the components (alone or in combination), other than memory structure 806, can be thought of as at least one control circuit or controller which is configured to perform the techniques described herein. For example, a control circuit may include any one of, or a combination of, address controller 808, state machine 810, address decoder 812, column decoder 834, power control 816, control processor 828, error correction unit 802, sense blocks SB1, SB2, . . . , SBp, read/write circuits 832, read/write controller 822, and so forth.

The read/write controller 822 may comprise a control processor 828, memory devices (memory) such as controller read-only memory 824 and controller volatile memory 826, and other functional units known in the art.

The memory devices of the read/write controller 822 may comprise code such as a set of instructions, and the control processor 828 is operable to execute the set of instructions to provide aspects of the functionality described herein. Alternatively or additionally, the control processor 828 can access code from the memory structure 806, such as a reserved area of memory cells in one or more word lines.

For example, code can be used by the read/write controller 822 to access the memory structure 806 for programming (write), read, and reset operations. The code can include boot code and control code (e.g., set of instructions). The boot code is software that initializes the read/write controller 822 during a booting or startup process and enables the read/write controller 822 to access the memory structure 806. The code can be used by the read/write controller 822 to control one or more memory structures. In one embodiment, upon being powered up, the control processor 828 fetches the boot code from the controller read-only memory 824 or memory structure 806 for execution, and the boot code initializes the system components and loads the control code into the controller volatile memory 826. Once the control code is loaded into the controller volatile memory 826, it is executed by the control processor 828. The control code includes drivers to perform basic tasks such as controlling and allocating memory, prioritizing the processing of instructions, and controlling input and output ports.

In some embodiments the read/write controller 822 may configure the dedicated burst write partition 840 in the memory structure 806 at a fixed location and size. In other embodiments, for example to implement wear leveling algorithms, the dedicated burst write partition 840 may change the location and/or size of the dedicated burst write partition 840 in the memory structure 806. The size or location of the dedicated burst write partition 840 may be changed for example after a number of programming operations on the memory cells in the dedicated burst write partition 840, or to comprise areas of the memory structure 806 having high concentrations of invalid (not marked for retention) data.

As noted prior the read/write controller 822 may dynamically evaluate the memory workload characteristics and set the size or location or both of the dedicated burst write partition 840 accordingly. In other cases the host device 836 will perform the profiling and/or configuration of the size or location or both of the dedicated burst write partition 840.

Generally, the control code can include instructions to perform the functions described herein including the phase change memory programming processes discussed previously, and provide the control signals discussed previously. The control code can implement a sequencer to control the timing (start and stop times, durations, spacing etc.) of the various actions described herein.

Although only a single dedicated burst write partition 840 is illustrated, there may be multiple ones that are not necessarily contiguous addresses in physical memory.

In one embodiment, the host device 836 is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the read/write controller 822 to perform the methods described herein. The host may also include additional system memory, one or more input/output interfaces and/or one or more input/output devices in communication with the one or more processors, as well as other components well known in the art.

The store region selector 814 may be a non-volatile memory such as NAND flash memory, or another type, implementing a memory map or address translation table. The store region selector 814 may select the dedicated burst write partition 840 in response to the burst write operation detector 842 detecting a burst write operation from the host device 836.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that the disclosed techniques and devices are not limited to the two-dimensional and three-dimensional exemplary structures described but covers all relevant memory structures within the spirit and scope of the technology as described herein and as understood by one of skill in the art.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

What is claimed is:

1. A memory device comprising a memory controller configured to:
   execute a background operation to prepare a dedicated burst write partition within a non-volatile memory;
   dynamically set a size of the dedicated burst write partition based on expected foreground burst write operation activity for the memory device and a latency of the background operation;
   wherein only a sub-region less than an entirety of the dedicated burst write partition is conditioned into a SET state during the background operation, based on a tradeoff of the latency of the background operation and a time and a capacity of the non-volatile memory available to carry out the foreground burst write operation activity; and
   in response to the foreground burst write activity apply only state change pulses for a RESET state to program the sub-region of the dedicated burst write partition with data of the foreground burst write activity.

2. The memory device of claim 1, wherein the non-volatile memory is a phase change memory.

3. The memory device of claim 1, the controller further configured to identify a subset of memory cells of the dedicated burst write partition based on the data of the foreground burst write activity.

4. A memory device comprising:
   a non-volatile memory; and
   a controller configured to:
   prepare a dedicated burst write partition in the non-volatile memory;
   dynamically set a size of the dedicated burst write partition based on expected burst write operation activity for the memory device and a latency of preparing the dedicated burst write partition;
   condition only a sub-region less than an entirety of the dedicated burst write partition into a SET state based on a tradeoff of the latency and a time and a capacity of the non-volatile memory available to carry out the burst write operation activity; and
   in response to the burst write operation activity apply only state change pulses for a RESET state to program the sub-region of the dedicated burst write partition with data of the burst write operation activity.

5. The memory device of claim 4, the controller configured to execute a foreground operation to direct the burst write operation activity to the sub-region of the dedicated burst write partition.

6. A method comprising:
   preparing a dedicated burst write partition in a phase change memory with a background operation of a memory device controller using only SET pulses;
   wherein a size of the dedicated burst write partition is dynamically set during the background operation based on expected burst write activity and a latency of the background operation, and only a sub-region less than an entirety of the dedicated burst write partition is prepared with the SET pulses based on a tradeoff of the latency and a time and capacity of the phase change memory available to carry out the burst write activity; and
   in response to a foreground burst write operation, apply only state change pulses for a RESET state to program the sub-region of the dedicated burst write partition with data of the burst write activity.

7. The method of claim 6, further comprising:
   analyzing the burst write operation to identify a subset of memory cells of the dedicated burst write partition to which to apply the RESET pulses.

8. The memory device of claim 4, the controller further configured to execute a background operation to dynamically set the size of the dedicated burst write partition and to condition only the sub-region into the SET state.

* * * * *